(12) United States Patent
Zhang et al.

(10) Patent No.: US 11,757,432 B2
(45) Date of Patent: Sep. 12, 2023

(54) DEVICE AND METHOD OF CORRECTING DUTY CYCLE

(71) Applicant: AP Memory Technology (Hangzhou) Limited Co, Hangzhou (CN)

(72) Inventors: Xuan Zhang, Hangzhou (CN); Po Han Chen, Hangzhou (CN); Keng Lone Wong, Hangzhou (CN); Alessandro Minzoni, Hangzhou (CN)

(73) Assignee: AP Memory Technology (Hangzhou) Limited Co, Hangzhou (CN)

( * ) Notice: Subject to any disclaimer, the term of this patent is extended or adjusted under 35 U.S.C. 154(b) by 0 days.

(21) Appl. No.: 17/697,501

(22) Filed: Mar. 17, 2022

(65) Prior Publication Data

US 2022/0302905 A1 Sep. 22, 2022

(30) Foreign Application Priority Data

Mar. 19, 2021 (CN) .......................... 202110295936.1

(51) Int. Cl.
*H03K 3/017* (2006.01)
*H03K 5/01* (2006.01)
(Continued)

(52) U.S. Cl.
CPC ............... *H03K 3/017* (2013.01); *G06F 1/08* (2013.01); *H03K 5/01* (2013.01); *H03K 19/20* (2013.01); *H03K 2005/00078* (2013.01)

(58) Field of Classification Search
CPC .......... H03K 3/017; H03K 5/01; H03K 19/20; H03K 2005/00078; H03K 5/131;
(Continued)

(56) References Cited

U.S. PATENT DOCUMENTS 7,839,194 B2 * 11/2010 Chang .................. H03K 5/1565
327/175
7,940,103 B2 * 5/2011 Satoh .................... H03K 5/1565
327/158
(Continued)

OTHER PUBLICATIONS

Taiwanese Office Action, dated Nov. 29, 2022, in a counterpart Taiwanese patent application, No. TW 111110087. (English translation of the search report is appended after the Chinese language document in the same PDF.

*Primary Examiner* — Ryan Jager
(74) *Attorney, Agent, or Firm* — Chen Yoshimura LLP

(57) ABSTRACT

A device of correcting duty cycle includes: a duty cycle correcting circuit, a controller of the duty cycle correcting circuit and a duty cycle detecting circuit. The duty cycle correcting circuit generates a pair of phase-shifting clocks in accordance with a pair of complementary clocks and regenerates a regenerated clock in accordance with the pair of phase-shifting clocks. The controller of the duty cycle correcting circuit couples to the duty cycle correcting circuit. The duty cycle detecting circuit couples to the duty cycle correcting circuit and the controller of the duty cycle correcting circuit, and generates a detecting output to the controller of the duty cycle correcting circuit in accordance with a current duty cycle of the regenerated clock. The controller of the duty cycle correcting circuit controls the duty cycle correcting circuit in accordance with the detecting output to adjust the pair of phase-shifting clocks.

21 Claims, 7 Drawing Sheets

(51) Int. Cl.
*G06F 1/08* (2006.01)
*H03K 19/20* (2006.01)
*H03K 5/00* (2006.01)

(58) Field of Classification Search
CPC ........ H03K 2005/00045; H03K 5/1565; G06F 1/08; G06F 1/12
USPC .......................................................... 327/175
See application file for complete search history.

(56) References Cited

U.S. PATENT DOCUMENTS

| | | | | |
|---|---|---|---|---|
| 8,466,726 | B2 * | 6/2013 | Satoh | H03L 7/0805 |
| | | | | 327/158 |
| 8,570,084 | B2 * | 10/2013 | Lin | H03K 5/133 |
| | | | | 327/175 |
| 9,197,202 | B2 * | 11/2015 | Jang | H03K 5/131 |
| 10,063,222 | B1 * | 8/2018 | Arp | H03K 7/08 |
| 10,326,435 | B2 * | 6/2019 | Arp | H03K 7/08 |
| 10,395,704 | B2 * | 8/2019 | Lee | G11C 8/18 |
| 10,529,398 | B1 * | 1/2020 | Lee | G11C 29/028 |
| 11,349,457 | B2 * | 5/2022 | Kim | H03L 7/0812 |
| 11,437,086 | B2 * | 9/2022 | Brox | G11C 11/4076 |
| 11,496,136 | B1 * | 11/2022 | Park | G06F 1/06 |
| 2008/0036509 | A1 * | 2/2008 | Jang | H03K 5/135 |
| | | | | 327/141 |
| 2010/0225372 | A1 * | 9/2010 | Satoh | H03L 7/0816 |
| | | | | 327/175 |
| 2010/0237917 | A1 | 9/2010 | Monma | |
| 2011/0291725 | A1 * | 12/2011 | Shin | G11C 7/222 |
| | | | | 327/175 |
| 2015/0097603 | A1 * | 4/2015 | Amirkhany | H03K 3/017 |
| | | | | 327/155 |
| 2015/0364176 | A1 * | 12/2015 | Lee | G11C 29/023 |
| | | | | 365/230.06 |
| 2017/0040986 | A1 * | 2/2017 | Ma | H03K 19/003 |
| 2019/0385654 | A1 * | 12/2019 | Lee | G11C 16/28 |
| 2022/0302905 | A1 * | 9/2022 | Zhang | H03K 19/20 |

* cited by examiner

DEVICE AND METHOD OF CORRECTING DUTY CYCLE

CROSS-REFERENCE TO RELATED APPLICATIONS

This application claims priority to P.R.C. Patent Application No. 202110295936.1 titled "Device and Method of Correcting Duty Cycle," filed on Mar. 19, 2021, with the State Intellectual Property Office of the People's Republic of China (SIPO).

TECHNICAL FIELD

The present disclosure relates to an electronic device, and particularly, to a device and method of correcting duty cycle.

BACKGROUND

In various electronic systems, a precise clock signal may be generated as a timing reference to control operation and communication between each electronic device, such as processors comprising central processing unit (CPU), digital signal processor (DSP), micro-processing unit (MPU), microcontroller unit (MCU), and memories comprising dynamic random access memory (DRAM), static random access memory (SRAM), etc. When considering a high-frequency system, stable rising edge and falling edge with small jitter are essential.

Duty cycle determines a ratio of an operation duration to a total time in a period. The duty cycle is an important parameter of a clock signal because it will affect a required bandwidth. In order to provide a precise and stable clock signal, a fixed duty cycle is needed. However, as electric devices are getting more and more complex, several problems such as long locking cycle, rigid circuit design, limited frequency and low stability. As such, it is necessary to generate a highly stable and precise clock signal with a fixed duty cycle to solve above-mentioned problems.

SUMMARY

In light of the abovementioned problems, an object of the present disclosure is to provide a device and method of correcting duty cycle which can solve the problem of long locking cycle, rigid circuit design, limited frequency and low stability in the prior art. Preferably, the device and method of correcting duty cycle may provide a highly stable and precise clock signal through a first delay line and a second delay line delaying a pair of complementary clocks to form a phase shift therebetween, so as to generate the clock signal with a fixed duty cycle and small jitter in rising edges and falling edges therein.

An objective of the present invention is to provide a device of correcting duty cycle, comprising: a duty cycle correcting circuit, a controller of the duty cycle correcting circuit and a duty cycle detecting circuit. The duty cycle correcting circuit generates a pair of phase-shifting clocks in accordance with a pair of complementary clocks and regenerates a regenerated clock in accordance with the pair of phase-shifting clocks. The controller of the duty cycle correcting circuit couples to the duty cycle correcting circuit. The duty cycle detecting circuit couples to the duty cycle correcting circuit and the controller of the duty cycle correcting circuit, and generates a detecting output to the controller of the duty cycle correcting circuit in accordance with a current duty cycle of the regenerated clock. The controller of the duty cycle correcting circuit controls the duty cycle correcting circuit in accordance with the detecting output to adjust the pair of phase-shifting clocks.

In a preferable embodiment of the present invention, the duty cycle correcting circuit may comprise a coarse adjustment delaying unit, a fine adjustment delaying unit and a regenerating circuit in series connection sequentially, the coarse adjustment delaying unit may delay the pair of complementary clocks to generate a pair of first clocks having a first phase shift, the fine adjustment delaying unit may delay the pair of first clocks to generate the pair of phase-shifting clocks having a second phase shift, and the regenerating circuit may regenerate the regenerated clock in accordance with the pair of phase-shifting clocks.

In a preferable embodiment of the present invention, the duty cycle detecting circuit may receive the regenerated clock, detects the current duty cycle of the regenerated clock, determine if the current duty cycle reaches a predetermined value, and output the detecting output in accordance with a determination to the controller of the duty cycle correcting circuit, and wherein the controller of the duty cycle correcting circuit may adjust delay of one of the coarse adjustment delaying unit and the fine adjustment delaying unit in the pair of complementary clocks to make the pair of phase-shifting clocks generated by the regenerating circuit.

In a preferable embodiment of the present invention, the coarse adjustment delaying unit may comprise a first delay line and a second delay line, both the first delay line and the second delay line may comprise a plurality of coarse adjustment steps, the coarse adjustment delaying unit may receive the pair of complementary clocks, delay the pair of complementary clocks on the first delay line and the second delay line with setting of the coarse adjustment steps to generate the pair of first clocks having the first phase shift between the pair of complementary clocks, and the first phase shift may correspond to increasing multiples of a coarse adjustment increment.

In a preferable embodiment of the present invention, the fine adjustment delaying unit may comprise a third delay line and a fourth delay line, the third delay line and the fourth delay line may comprise a plurality fine adjustment steps, the fine adjustment delaying unit may receive the pair of first clocks having the first phase shift, delay the pair of first clocks having the first phase shift on the third delay line and the fourth delay line with setting of the fine adjustment steps to generate the pair of phase-shifting clocks having the second phase shift between the pair of first clocks, and the second phase shift may correspond to increasing multiples of a fine adjustment increment, and wherein the coarse adjustment increment may be greater than the fine adjustment increment.

In a preferable embodiment of the present invention, each of the first delay line and the second delay line further may comprise: P first NAND gates in series with each other, one of the pair of complementary clocks input to a first one of the P first NAND gates; P second NAND gates in series with each other; P third NAND gates in parallel with the first NAND gates and the second NAND gates, an input end of a n-th third NAND gate coupling to a n-th first NAND gate, an output end of a n-th third NAND gate coupling to an input end of a P-n+1-th second NAND gate, n being an integer of 1, 2 . . . P; and an inverter, coupling to an output end of a P-th second NAND gate.

In a preferable embodiment of the present invention, each of the third delay line and the fourth delay line may comprise: a plurality of inverters in series with each other, and one of the pair of first clocks having the first phase shift input to a first one of the inverters; and a plurality of variable capacitor, coupling to an output end of the inverters respectively.

In a preferable embodiment of the present invention, the coarse adjustment increment may be greater than or equal to twice of the fine adjustment increment.

In a preferable embodiment of the present invention, the coarse adjustment increment may be greater than or equal to ten times of the fine adjustment increment.

In a preferable embodiment of the present invention, when the detecting output indicates that the current duty cycle is greater than a predetermined value, the controller of the duty cycle correcting circuit may increase delay of the pair of complementary clocks on the first delay line or decrease delay of the pair of complementary clocks on the second delay line in accordance with the detecting output to generate the pair of first clocks having less first phase shift, and when the detecting output indicates that the current duty cycle is less than the predetermined value, the controller of the duty cycle correcting circuit may decrease the delay of the pair of complementary clocks on the first delay line or increase the delay of the pair of complementary clocks on the second delay line in accordance with the detecting output to generate the pair of first clocks having more first phase shift.

In a preferable embodiment of the present invention, the regenerating circuit may regenerate the regenerated clock having a new duty cycle in accordance with the pair of phase-shifting clocks, and compared with the current duty cycle, the new duty cycle may be closer to the predetermined value.

In a preferable embodiment of the present invention, the regenerating circuit may further comprise: two fourth NAND gates, receiving one of the pair of phase-shifting clocks respectively and a corresponding delayed clock and outputting a rising-edge triggering clock and a falling-edge triggering clock respectively; and two fifth NAND gates, one of the fifth NAND gates receiving the rising-edge triggering clock and output of the other one of the fifth NAND gates, the other one of the fifth NAND gates receiving the falling-edge triggering clock and output of the one of the fifth NAND gates, and outputting the regenerated clock.

In a preferable embodiment of the present invention, the regenerating circuit may further comprise: two sets of logic gates, each set of logic gates comprises a AND gate and a NOT gate, in series with an input end of the fourth NAND gates, delaying one of the pair of phase-shifting clocks to generate the corresponding delayed clock.

In a preferable embodiment of the present invention, the device of correcting duty cycle may further comprise a splitter generating the pair of complementary clocks in which two clocks are complementary to each other.

An objective of the present invention is to provide a method of correcting duty cycle, comprising steps of: generating a pair of phase-shifting clocks in accordance with a pair of complementary clocks; regenerates a regenerated clock in accordance with the pair of phase-shifting clocks; generating a detecting output in accordance with a current duty cycle of the regenerated clock; and adjusting the pair of phase-shifting clocks in accordance with the detecting output.

In a preferable embodiment of the present invention, the step of generating a pair of phase-shifting clocks in accordance with a pair of complementary clocks may further comprise: delaying the pair of complementary clocks with a coarse adjustment delaying unit to generate a pair of first clocks; delaying the pair of first clocks with a fine adjustment delaying unit to generate the pair of phase-shifting clocks; and regenerating the regenerated clock in accordance with a phase-shift signal.

In a preferable embodiment of the present invention, the step of generating a detecting output in accordance with a current duty cycle of the regenerated clock may further comprise: detecting the current duty cycle of the regenerated clock; and determining if the current duty cycle reaches a predetermined value and outputting the detecting output in accordance with a determination.

In a preferable embodiment of the present invention, the coarse adjustment delaying unit may comprise a first delay line and a second delay line, both the first delay line and the second delay line may comprise a plurality of the coarse adjustment steps, and the step of delaying the pair of complementary clocks with a coarse adjustment delaying unit to generate a pair of first clocks, performed by the coarse adjustment delaying unit may further comprise: delaying the pair of complementary clocks on the first delay line and the second delay line with setting of the coarse adjustment steps to generate the pair of first clocks having a first phase shift between the pair of complementary clocks, and generating the first phase shift corresponding to increasing multiples of a coarse adjustment increment.

In a preferable embodiment of the present invention, the fine adjustment delaying unit may comprise a third delay line and a fourth delay line, both the third delay line and the fourth delay line may comprise a plurality of the fine adjustment steps, and the step of delaying the pair of first clocks with a fine adjustment delaying unit to generate the pair of phase-shifting clocks may further comprise: delaying the pair of first clocks having the first phase shift on the third delay line and the fourth delay line with setting of the fine adjustment steps to generate the pair of phase-shifting clocks having a second phase shift between the pair of first clocks, and generating the second phase shift corresponding to increasing multiples of a fine adjustment increment; wherein the coarse adjustment increment may be greater than the fine adjustment increment.

In a preferable embodiment of the present invention, the method of correcting duty cycle may further comprise providing the coarse adjustment increment which is greater than or equal to twice of the fine adjustment increment.

In a preferable embodiment of the present invention, the method of correcting duty cycle may further comprise providing the coarse adjustment increment which is greater than or equal to ten times of the fine adjustment increment.

In a preferable embodiment of the present invention, the step of delaying the pair of complementary clocks on the first delay line and the second delay line with setting of the coarse adjustment steps to generate the pair of first clocks having a first phase shift between the pair of complementary clocks may further comprise: when the detecting output indicates that the current duty cycle is greater than the predetermined value, increasing delay of the pair of complementary clocks on the first delay line or decreasing delay of the pair of complementary clocks on the second delay line in accordance with the detecting output to generate the pair of first clocks having less first phase shift; and when the detecting output indicates that the current duty cycle is less than the predetermined value, decreasing the delay of the pair of complementary clocks on the first delay line or increasing the delay of the pair of complementary clocks on the second delay line to generate the pair of first clocks having more first phase shift.

In a preferable embodiment of the present invention, the method of correcting duty cycle may further comprise regenerating the regenerated clock having a new duty cycle in accordance with the pair of phase-shifting clocks, wherein compared with the current duty cycle, the new duty cycle may be closer to the predetermined value.

BRIEF DESCRIPTION OF THE DRAWINGS

Exemplary embodiments will be more readily understood from the following detailed description when read in conjunction with the appended drawings, in which.

DETAILED DESCRIPTION

The embodiments of the present invention are described below by way of specific examples of a device and method of correcting duty cycle, and those skilled in the art can readily understand other advantages and effects of the present invention from the disclosure of the present disclosure. The present invention may be embodied or applied in various other specific embodiments, and various modifications and changes can be made without departing from the spirit and scope of the invention. The appended drawings are drawn in a schematic manner for merely illustrate the basic concept of the present invention, instead of precise proportion of components in actual implementation.

Figure 1:
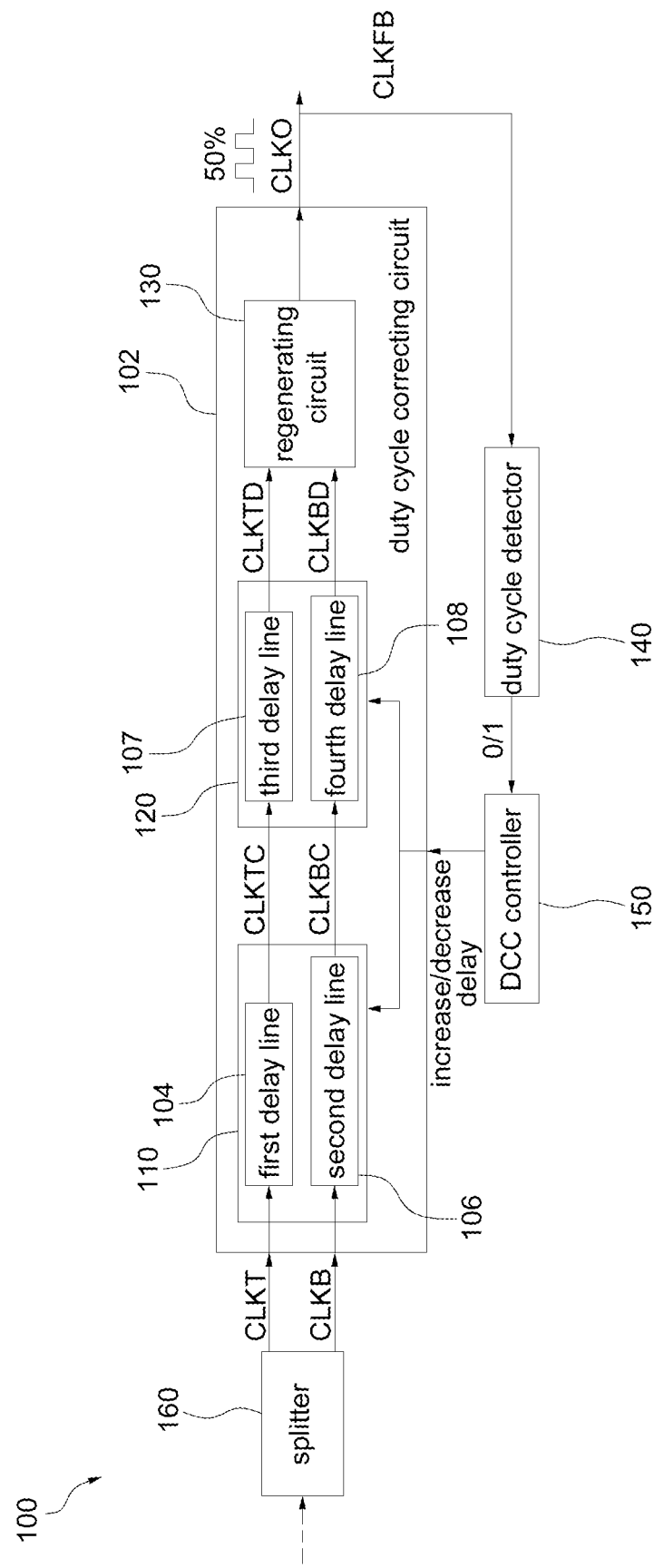
FIG. 1 depicts a functional block diagram of a device of correcting duty cycle according to an exemplary embodiment of the present invention.

Referring to FIG. 1, a functional block diagram of a device of correcting duty cycle according to an exemplary embodiment of the present invention is shown. As shown in FIG. 1, a device for correcting duty cycle, here called duty cycle correction (DCC) device 100, may comprise a duty cycle correcting circuit 102, a duty cycle detecting circuit, here called duty cycle detector (DCD) 140 too, a controller of the duty cycle correcting circuit 150 and a splitter 160. Through operation of the DCC device 100 and depending on the designer requirement, a clock signal with a fixed duty cycle may be generated, in which the duty cycle may be closed to a predetermined value; preferably, the clock signal may be highly stable and precise. Here, it is assumed that the predetermined duty cycle value is 50%, but it may be not limited to the exemplary value. For example, the predetermined value may be 75%.

The DCC device 100 may be applied in an electrical device (not shown). Preferably, the electrical device may be an integrated circuit, such as: a processor comprising one of central processing unit (CPU), digital signal processor (DSP), micro-processing unit (MPU), microcontroller unit (MCU), and a memory comprising dynamic random access memory (DRAM), static random access memory (SRAM), etc. The electrical device may be a slave electrical device or a master electrical device, and may perform internal operate and/or external communication in complying with an interface protocol, receiving or issuing commands and/or data based on the clock signal. Here, the interface protocol may not be limited a specific type; for example, it may be UART (Universal Asynchronous Receiver/Transmitter), I2C (Inter-Integrated Circuit), I2S (Inter-IC Sound Bus), SPI (Serial Peripheral Interface), GPIO (General-Purpose Input/Output), SDIO (Secure Digital Input/Output interface), etc.

The splitter 160 may generate a pair of complementary clocks CLKT, CLKB complementary to each other according to an original clock signal coming from interior or exterior of the electrical device. In some embodiments, when the original clock signal is a pair of complementary signals, the splitter may not be needed.

The duty cycle correcting circuit 102 may generate a pair of phase-shifting clocks CLKTD, CLKBD in complying with the pair of complementary clocks CLKT, CLKB, and regenerates a regenerated clock CLKO in complying with the pair of phase-shifting clocks CLKTD, CLKBD. The controller of the duty cycle correcting circuit 150 may couple to the duty cycle correcting circuit 102. The duty cycle detecting circuit 140, which is coupled between the duty cycle correcting circuit 102 and the controller of the duty cycle correcting circuit 150, may generate a detecting output (0/1) in complying with a current duty cycle of the regenerated clock CLKO and output the detecting output to the controller of the duty cycle correcting circuit 150.

The duty cycle correcting circuit 102 may comprise a coarse adjustment delaying unit 110, a fine adjustment delaying unit 120 and a regenerating circuit 130, all of which are in series connection sequentially. The coarse adjustment delaying unit 110 may delay the pair of complementary clocks CLKT, CLKB to generate a pair of first clocks having the first phase shift CLKTC, CLKBC. The fine adjustment delaying unit 120 may delay the pair of first clocks CLKTC, CLKBC to generate a pair of phase-shifting clocks having the second phase shift CLKTD, CLKBD. The regenerating circuit 140 may regenerate the regenerated clock CLKO in complying with the pair of phase-shifting clocks CLKTD, CLKBD.

The duty cycle detecting circuit 140 may receive the regenerated clock CLKO, detect the current duty cycle of the regenerated clock CLKO, determine if the current duty cycle reaches the predetermined value, and output the detecting output generated in accordance with a determination to the controller of the duty cycle correcting circuit 150. The controller of the duty cycle correcting circuit 150 then may adjust delay of the pair of complementary clocks CLKT, CLKB, created by one of the coarse adjustment delaying unit 110 and the fine adjustment delaying unit 120, to make the pair of phase-shifting clocks CLKTD, CLKBD generated by the regenerating circuit 130.

The coarse adjustment delaying unit 110 may comprise a first delay line 104 and a second delay line 106. The first delay line 104 and the second delay line 106 may delay the pair of complementary clocks CLKT, CLKB to generate the pair of first clocks having the first phase shift CLKTC, CLKBC respectively. The fine adjustment delaying unit 120 may comprise a third delay line 107 and a fourth delay line 108. The third delay line 107 and the fourth delay line 108 may delay the pair of first clocks CLKTC, CLKBC to generate the pair of phase-shifting clocks having the second phase shift CLKTD, CLKBD respectively. In the present embodiment, delay of the pair of complementary clocks CLKT, CLKB on the first delay line 104, the second delay line 106 may be varied within a range of 10% of a period. Briefly speaking, the coarse adjustment delaying unit 110 may delay the pair of complementary clocks CLKT, CLKB to generate the pair of first clocks CLKTC, CLKBC which are coarse-delayed firstly, and then the fine adjustment delaying unit 120 may delay the coarse-delayed pair of first clocks CLKTC, CLKBC to generate the pair of phase-shifting clocks having the second phase shift CLKTD, CLKBD. Details may be illustrated hereinafter. The coarse adjustment delaying unit 110 and the fine adjustment delaying unit 120 may generate different quantity of delay of the pair of complementary clocks CLKT, CLKB. For example, a step of a coarse adjustment increment created by the coarse adjustment delaying unit 110 is much greater than a step of a fine adjustment increment created by the fine adjustment delaying unit 12. Preferably, the coarse adjustment increment may be greater than or equal to twice of the fine adjustment increment, and more preferably, the coarse adjustment increment may be greater than or equal to ten times of the fine adjustment increment, but not limited to this. The difference between delay quantity applied to the pair of complementary clocks CLKT, CLKB may be proportional to quantity of phase shift between the pair of phase-shifting clocks CLKTD, CLKBD, and the difference may affect value of the duty cycle in a final clock signal later.

Figure 2:
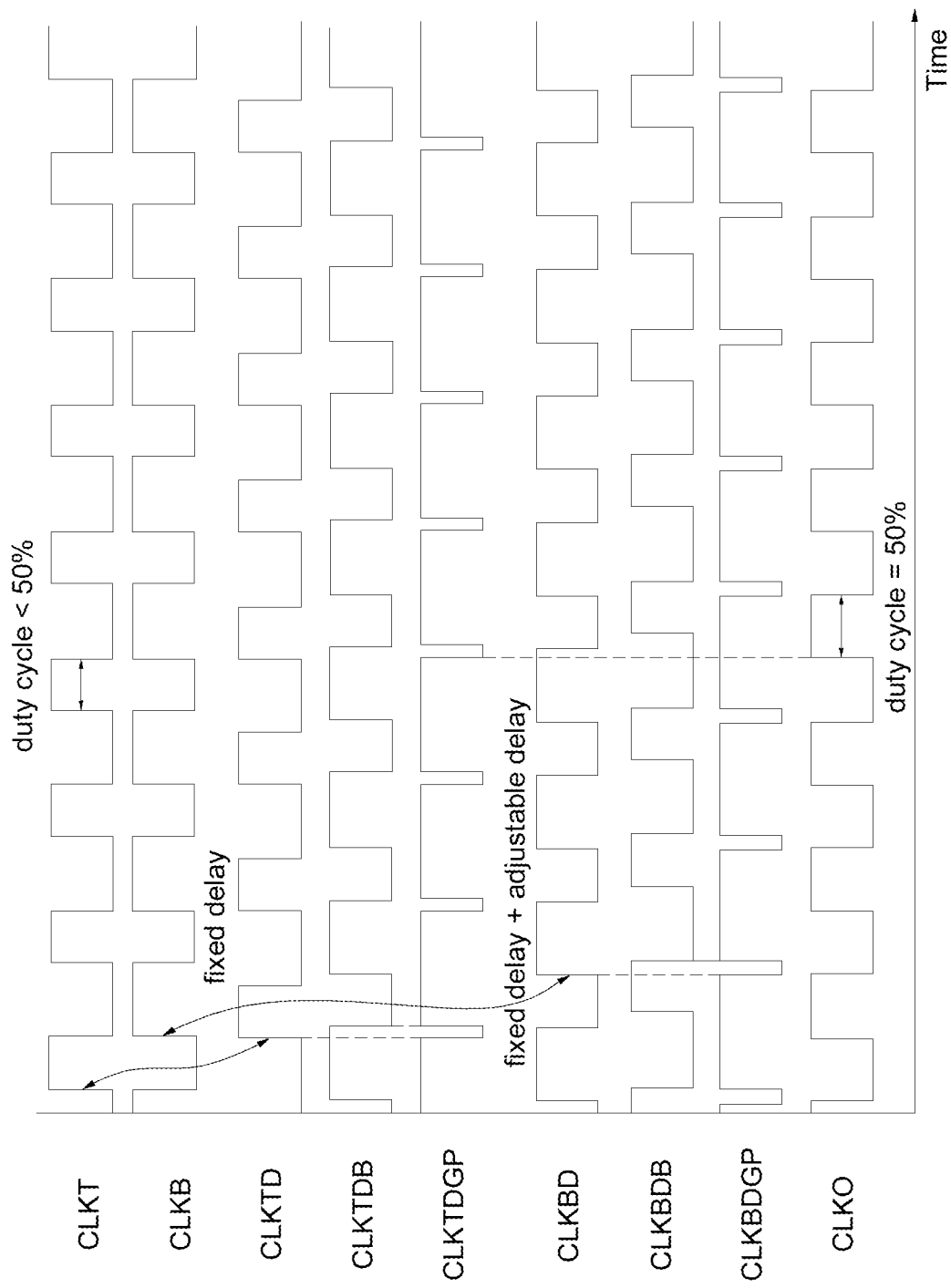
FIG. 2 depicts a schematical diagram of clock signals of a duty cycle correcting circuit according to an exemplary embodiment of the present invention.
Figure 3:
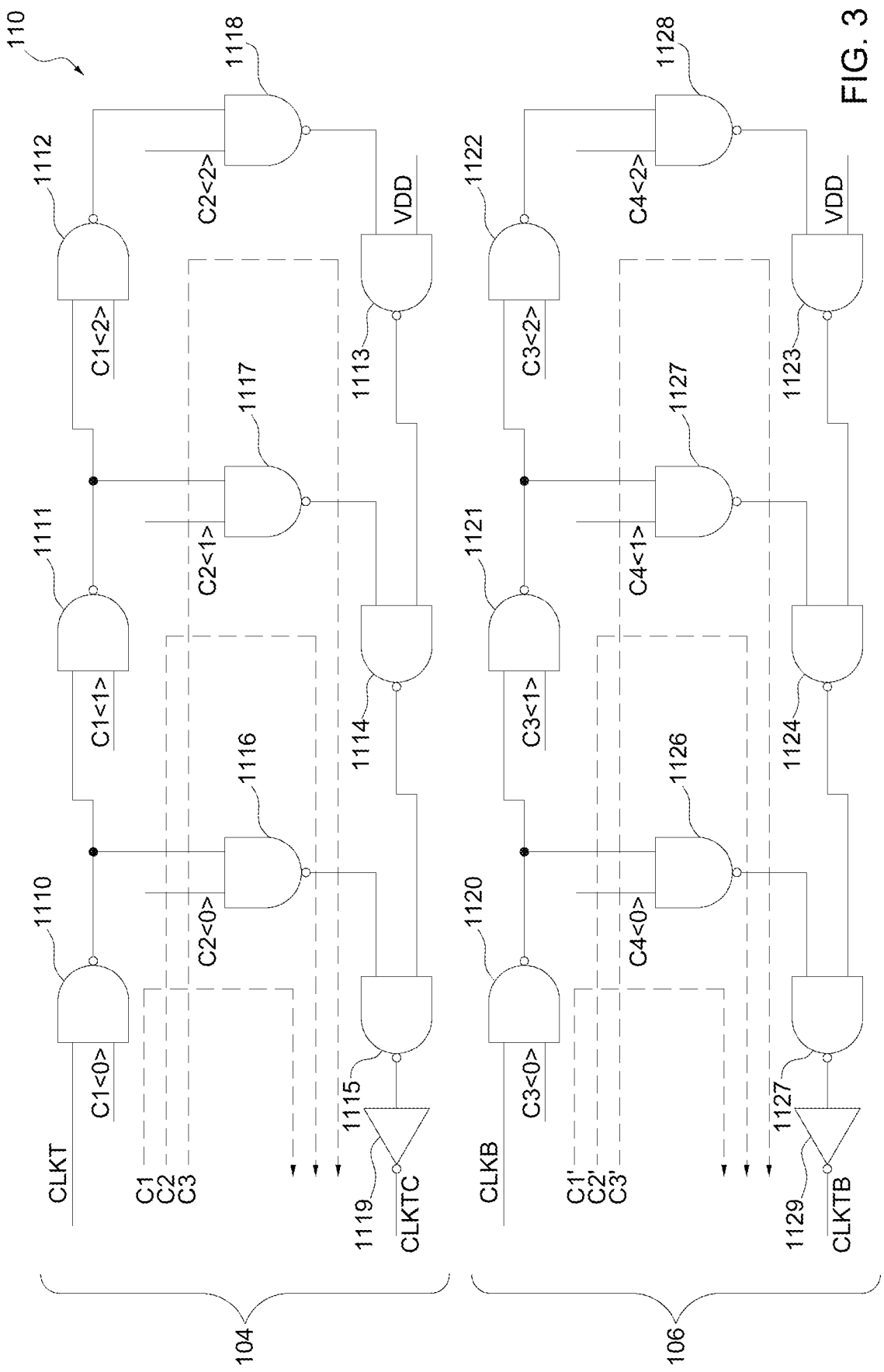
FIG. 3 depicts a functional block diagram of clock signals of a coarse adjustment delaying unit according to an exemplary embodiment of the present invention.

Referring to FIGS. 1-3, in which FIG. 2 shows a schematical diagram of clock signals of a duty cycle correcting circuit according to an exemplary embodiment of the present invention, FIG. 3 shows a functional block diagram of clock signals of a coarse adjustment delaying unit according to an exemplary embodiment of the present invention. As shown in FIG. 2, the coarse adjustment delaying unit 110 of the present embodiment may exemplarily comprise two sets of hardware structure to configure the first delay line 104 and the second delay line 106, and devices in each of the set are preferably in the same format and type to eliminate errors due to inherent differences. The first delay line 104 may be configured with a number of P first NAND gates 1110, 1111, 1112, P second NAND gates 1113, 1114, 1115, P third NAND gates 1116, 1117, 1118 and an inverter 1119 in hardware. The second delay line 106 may be configured with P first NAND gates 1120, 1121, 1122, P second NAND gates 1123, 1124, 1125, P third NAND gates 1126, 1127, 1128 and an inverter 1129 in hardware. Here, P may be 3 for example, but it may not be limited to it. In some embodiments, P may be other integer, or each set of hardware structure may be set by different integers. In each set, the first NAND gates 1110, 1111, 1112/1120, 1121, 1122 may be in series connection with each other, and one of the pair of complementary clocks CLKT, CLKB may be input to a first one of the first NAND gates 1110/1120. For example, CLKT signal of the pair of complementary clocks may be input to the one corresponding to the first delay line 104, and CLKB signal of the pair of complementary clocks may be input to the one corresponding to the second delay line 106. The second NAND gates 1113, 1114, 1115/1123, 1124, 1125 of each set may be in series connection with each other. The third NAND gates 1116, 1117, 1118/1126, 1127, 1128 of each set may be in parallel connection with the first NAND gates 1110, 1111, 1112/1120, 1121, 1122 and the second NAND gates 1113, 1114, 1115/1123, 1124, 1125, an output end of the n-th third NAND gates 1116/1117/1118/1126/1127/1128 may couple to n-th first NAND gates 1110/1111/1112/1120/1121/1122, an output end of the n-th third NAND gates 1116/1117/1118/1126/1127/1128 may couple to an input end of the P-n+1-th second NAND gates 1113/1114/1115/1123/1124/1125, and n may be an integer, such as 1, 2 . . . P. Through such configuration, the pair of complementary clocks CLKT, CLKB may be transmitted and passed different sections C1/C2/C3/C1'/C2'/C3' on the first delay line 104, the second delay line 106 in a variable manner, so as to accumulate transmission delay caused by different numbers of the first NAND gates 1110/1111/1112/1120/1121/1122, second NAND gates 1113/1114/1115/1123/1124/1125 and the third NAND gates 1116/1117/1118/1126/1127/1128 to make the pair of complementary clocks CLKT, CLKB delayed with different quantities and eventually a phase shift generated. The phase shift created by the coarse adjustment delaying unit 110 here is called first phase shift. For example, when CLKT signal of the pair of complementary clocks is transmitted on the step C1 of the first delay line 104 and CLKB signal of the pair of complementary clocks is transmitted on the step C2' of the second delay line 106, CLKT signal is delayed by a total of 3 NAND gates, comprising the first NAND gates 1110, the second NAND gates 1115, the third NAND gates 1116 and the inverter 1119, and CLKB signal is delayed by a total of 5 NAND gates, comprising the first NAND gates 1120, 1121, the second NAND gates 1124, 1125, the third NAND gates 1127 and the inverter 1129. In other words, one step difference may result in a delay difference caused by two NAND gates, called a coarse adjustment increment, and two step difference may result in another delay difference caused by twice the coarse adjustment increment. When implementing the present embodiment, the coarse adjustment increment may be but not limited to about 100 ps. Therefore, after the coarse adjustment delaying unit 110 receives the pair of complementary clocks CLKT, CLKB, a pre-set coarse adjustment step may be used to delay CLKB signal on the second delay line to make the first phase shift generated by the pair of complementary clocks CLKT, CLKB, so as to generate the pair of first clocks having the first phase shift CLKTC, CLKBC. The first phase shift may correspond to increasing multiples of a coarse adjustment increment.

Figure 4:
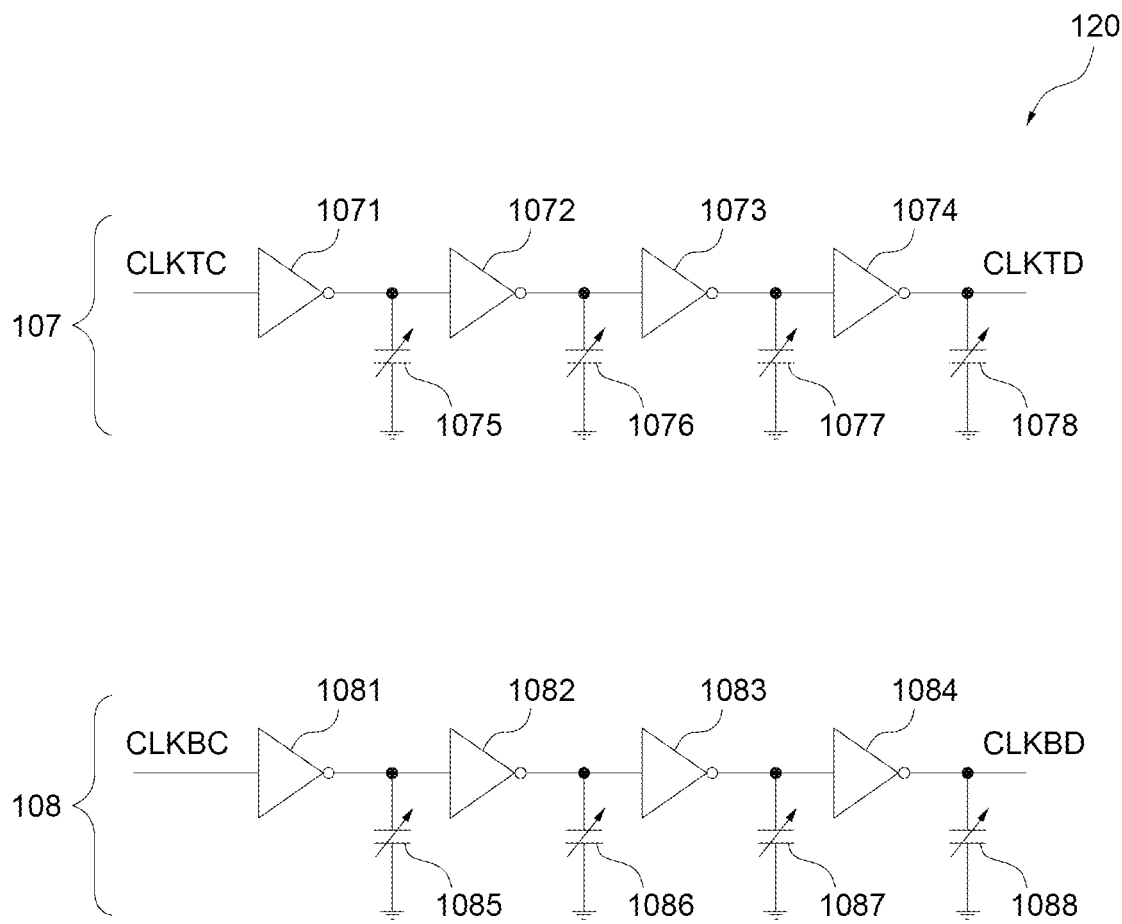
FIG. 4 depicts a functional block diagram of clock signals of a fine adjustment delaying unit according to an exemplary embodiment of the present invention.
Figure 5:
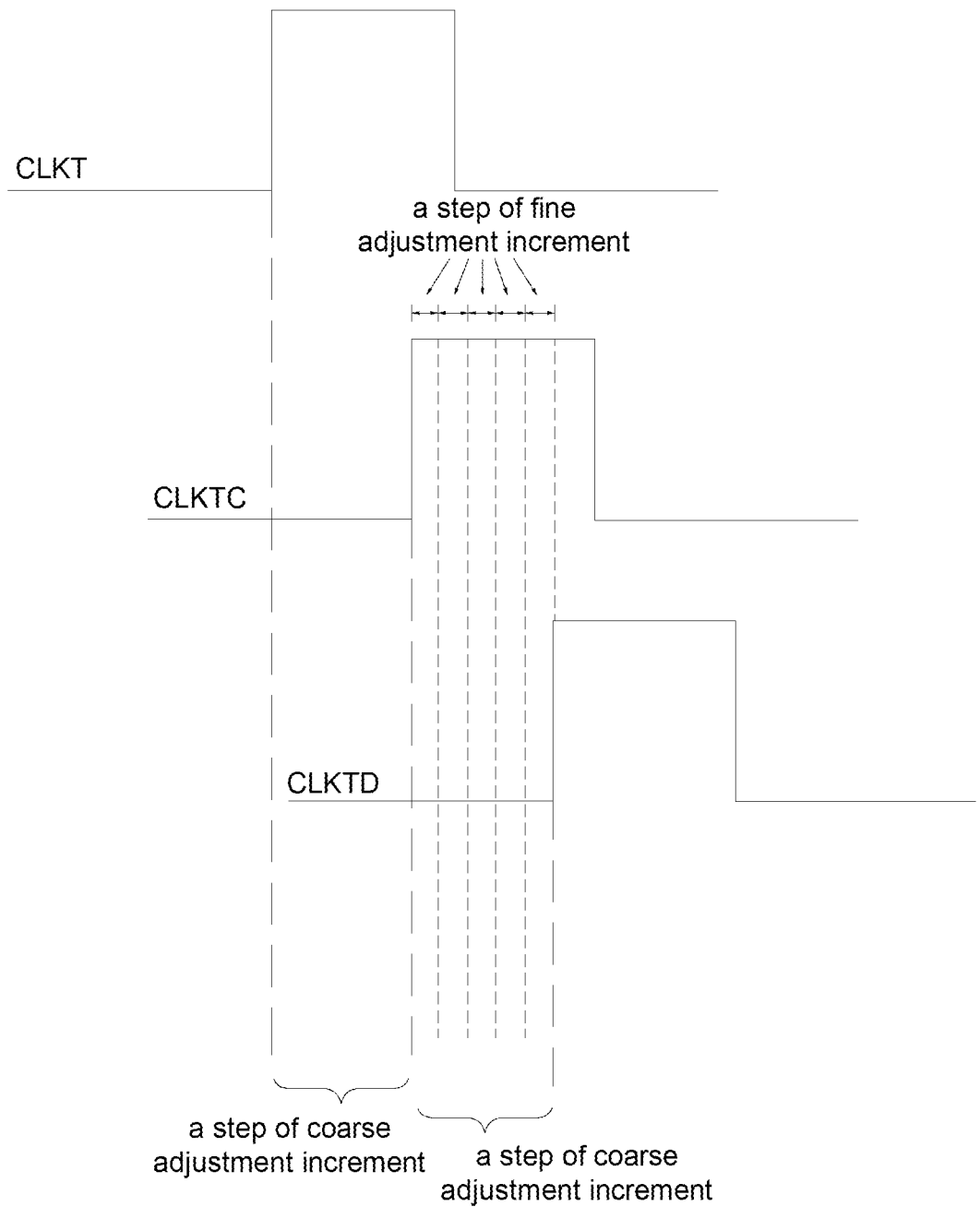
FIG. 5 depicts another schematical diagram of clock signals of the duty cycle correcting circuit according to an exemplary embodiment of the present invention.

To control the phase shift between the pair of first clocks CLKTC, CLKBC more precisely, the present embodiment may comprise a step of fine delay. Referring to FIGS. 1, 2, 4 and 5, FIG. 4 depicts a functional block diagram of clock signals of a fine adjustment delaying unit according to an exemplary embodiment of the present invention, and FIG. 5 depicts another schematical diagram of clock signals of the duty cycle correcting circuit according to an exemplary embodiment of the present invention. As shown in FIG. 4, the fine adjustment delaying unit 120 may comprise two sets of hardware structure to configure a third delay line 107 and a fourth delay line 108, and devices in each of the set are preferably in the same format and type to eliminate errors due to inherent differences. The third delay line 107 may comprise a plurality of inverters 1071, 1072, 1073, 1074 and a plurality of variable capacitors 1075, 1076, 1077, 1078 to delay input CLKTC signal. The fourth delay line 108 may comprise a plurality of inverters 1081, 1082, 1083, 1084 and a plurality of variable capacitors 1085, 1086, 1087, 1088 to delay input CLKBC signal. In the third delay line 107, number of the inverters 1071, 1072, 1073, 1074 and the variable capacitors 1075, 1076, 1077, 1078 may be but not limited to 4. The inverters 1071, 1072, 1073, 1074 may be in series connection with each other, and the first inverter 1071 may receive CLKTC signal. The variable capacitors 1075, 1076, 1077, 1078 may couple to an output end of the inverters 1071, 1072, 1073, 1074 respectively to be used as load capacitor of inverters 1071, 1072, 1073, 1074. A step is formed by each inverter 1071/1072/1073/1074 and a variable capacitor 1075/1076/1077/1078 connecting to the output end of the inverter 1071/1072/1073/1074. For example, the inverter 1071 and the variable capacitor 1075 may form a first step, the inverter 1072 and the variable capacitor 1076 may form a second step. As such, one step difference may result in one fine adjustment increment, which is caused by charging/discharging time of the variable capacitor 1075/1076/1077/1078. The fine adjustment delaying unit 120 may control capacitance of the variable capacitor 1075, 1076, 1077, 1078 respectively to control number of step of fine delay applied to CLKTC signal. For example, when the capacitance of the variable capacitors 1075, 1076 are 100 fF and the capacitance of the variable capacitors 1077, 1078 approach to zero, two steps of fine delay may be applied, i.e. CLKTC signal is delayed with twice of the fine adjustment increment. When implementing the present embodiment, the fine adjustment increment may be but not limited to about 20 ps. Namely, in the fourth delay line 108, number of the inverters 1081, 1082, 1083, 1084 and the variable capacitors 1085, 1086, 1087, 1088 may be but not limited to 4. The inverters 1081, 1082, 1083, 1084 may be in series connection with each other, and a first one of the inverters 1081, 1082, 1083, 1084 may receive CLKBC signal. Because the fourth delay line 108 and the third delay line 107 are constructed with the same hardware structure and controlled by the same manner, details of the fourth delay line 108 are not repeated here.

It may be readily understood that the coarse adjustment increment is greater than the fine adjustment increment, and preferably the coarse adjustment increment is greater than or equal to twice of the fine adjustment increment, and more preferably the coarse adjustment increment is greater than or equal to ten times of the fine adjustment increment. Through aforesaid configuration, CLKBC signal of the pair of first clocks having the first phase shift CLKTC, CLKBC may be fine-delayed with a controllable number of step on the fourth delay line 108 of the fine adjustment delaying unit 120, and CLKTC signal may be fine-delayed with a controllable number of step on the third delay line 107 of the fine adjustment delaying unit 120, so as to make the pair of first clocks having the first phase shift CLKTC, CLKBC delayed with different quantity of delay to form an additional phase shift. Here, the phase shift created by the fine adjustment delaying unit 120 is called second phase shift. Therefore, the fine adjustment delaying unit 120 may receive the pair of first clocks CLKTC, CLKBC having the first phase shift, and set the fine adjustment steps on the third delay line 107 and the fourth delay line 108 to delay the pair of first clocks CLKTC, CLKBC having the first phase shift respectively, so as to generate the second phase shift additionally applied to the pair of first clocks CLKTC, CLKBC having the first phase shift, and finally generate the pair of phase-shifting clocks CLKTD, CLKBD. The second phase shift may correspond to increasing multiples of a fine adjustment increment. The phase shift between the pair of phase-shifting clocks CLKTD, CLKBD may be a sum of the first phase shift and the second phase shift. In some embodiments, in the fine adjustment delaying unit, the third delay line 107 may be omitted, and only the fourth delay line 108 may be configured to delay CLKBC signal, and at this time, CLKTC signal may connect to the regenerating circuit 130 directly from the first delay line 104.

In the present embodiment, after the coarse delay of the coarse adjustment delaying unit 110 and the fine delay of the fine adjustment delaying unit 120, a fixed delay of CLKT signal on the first delay line 104 and the third delay line 107 is generated, the fixed delay and an adjustable delay of CLKB signal on the second delay line 106 and the fourth delay line 108 is generated, and the adjustable delay is the difference between the delay quantity of the two signals. It may be understood that the adjustable delay is a sum of a multiple of the fine adjustment increment and a multiple of the fine adjustment increment.

Figure 6:
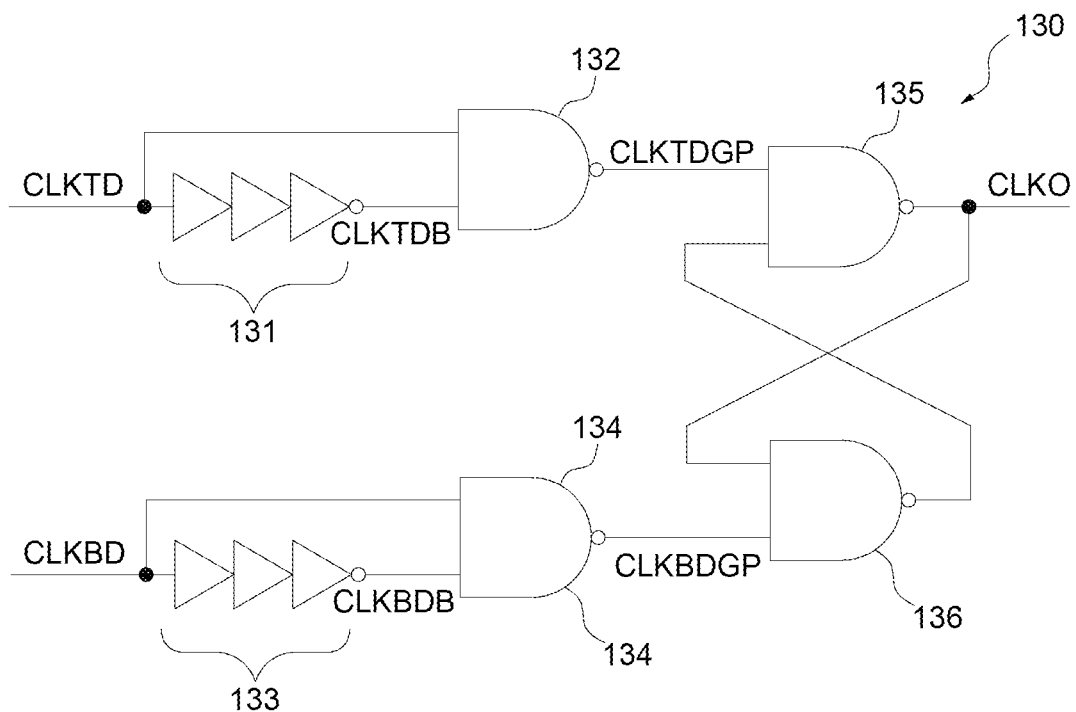
FIG. 6 depicts a functional block diagram of clock signals of a regenerating circuit according to an exemplary embodiment of the present invention.
Figures 7, 8:
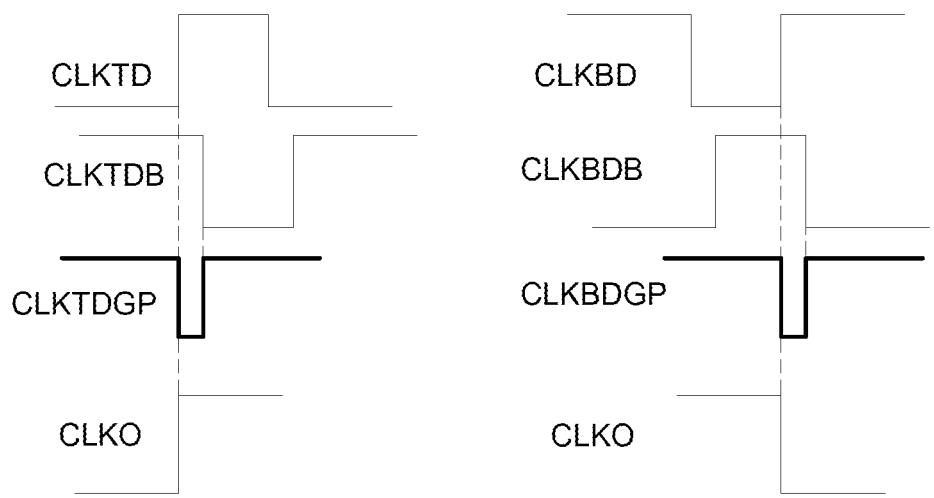
FIG. 7 depicts yet another schematical diagram of clock signals of the duty cycle correcting circuit according to an exemplary embodiment of the present invention.
FIG. 8 depicts yet another schematical diagram of clock signals of the duty cycle correcting circuit according to an exemplary embodiment of the present invention.

Referring to FIGS. 1, 2, 6, 7 and 8, in which FIG. 6 depicts a functional block diagram of clock signals of a regenerating circuit according to an exemplary embodiment of the present invention, FIG. 7 depicts yet another schematical diagram of clock signals of the duty cycle correcting circuit according to an exemplary embodiment of the present invention, and FIG. 8 depicts yet another schematical diagram of clock signals of the duty cycle correcting circuit according to an exemplary embodiment of the present invention. The regenerating circuit 130 may comprise a plurality of logic gates 131, 133, two fourth NAND gates 132, 134 and two fifth NAND gates 135, 136. Both of the logic gates 131, 133 may comprise two AND gates and one NOT gate, in series connection with an input end of the fourth NAND gates 132, 134, delay a clock of the pair of phase-shifting clocks CLKTD, CLKBD having a phase shift therebetween, to generate corresponding delayed clocks CLKTDB, CLKBDB. The fourth NAND gates 132, 134 may receive one of the pair of phase-shifting clocks CLKTD, CLKBD having the phase shift and the corresponding delayed clock CLKTDB, CLKBDB, and output a rising-edge triggering clock CLKTDGP and a falling-edge triggering clock CLKBDGP respectively. One of the fifth NAND gates 135, 136, such as: the fifth NAND gates 135 may receive the rising-edge triggering clock CLKTDGP and output of another fifth NAND gate 136, and the fifth NAND gate 136 may receive the falling-edge triggering clock CLKBDGP and output of the fifth NAND gate 135. The output may be the regenerated clock CLKO. As such, the regenerating circuit 130 may regenerate the regenerated clock CLKO in complying with the pair of phase-shifting clocks CLKTD, CLKBD having the phase shift. Specifically, as shown in FIG. 7, through the phase shift of the pair of phase-shifting clocks CLKTD, CLKBD, duration of positive/negative going pulse of the regenerated clock CLKO may be formed through one of the pair of phase-shifting clocks CLKTD, CLKBD having the phase shift, such as: CLKTD signal determining a rising edge of the regenerated clock CLKO, and another one of the pair of phase-shifting clocks CLKTD, CLKBD having the phase shift, such as: CLKBD signal determining a falling edge of the regenerated clock CLKO. When implementing the present embodiment, NAND pulse of CLKTD/CLKBD signal and delayed CLKTDB/CLKBDB signal may be used to capture the rising edge of CLKTD signal or the rising edge of CLKBD signal. Because period of the regenerated clock CLKO is known, a ratio of duration of the positive pulse of the regenerated clock CLKO to a period of the pulse of the regenerated clock CLKO may be duty cycle. In other words, the regenerated clock CLKO is not generated by the regenerating circuit 130 with the pair of phase-shifting clocks CLKTD, CLKBD directly, rather regenerated with the second phase shift of the pair of phase-shifting clocks CLKTD, CLKBD. Through above-mentioned manner, the regenerated clock CLKO having a fixed duty cycle may be generated, and preferably the regenerated clock CLKO may be provided as a highly stable and precise clock signal.

It may be readily understood that the size of the phase shift of the pair of phase-shifting clocks CLKTD, CLKBD may be adjusted through controlling the third delay line 107 and the fourth delay line 108, so as to adjust value of the duty cycle of the regenerated clock CLKO, and as such, different duty cycles of the regenerated clock CLKO may be generated to improve flexibility of the DCC device 100. In the present embodiment, the duty cycle detecting circuit 140 may be configured to couple to the DCC circuit 102 and the controller of the DCC circuit 150 to receive a feedback signal CLKFB of the DCC circuit 102, and the feedback signal CLKFB may be aforesaid coarse-delayed pair of first clocks CLKTC, CLKBC, the pair of phase-shifting clocks CLKTD, CLKBD or the regenerated clock CLKO. The duty cycle detecting circuit 140 may detect a current duty cycle of the feedback signal CLKFB for determination that if the current duty cycle reaches the predetermined value and generating output to the controller of the DCC circuit 150 according to the determination. The controller of the DCC circuit 150 may be configured to couple to the DCC circuit 102 to accordingly control the DCC circuit 102 according to output of the duty cycle detecting circuit 140. In the present embodiment, aforesaid output may be "0" indicating that current duty cycle is too large or "1" indicating that current duty cycle is too small, but not limited to the exemplary values. In some embodiments, the output may be other type of signal or other value(s) indicating these situations. As such, the first delay line 104, the second delay line 106, the third delay line 107 and the fourth delay line 108 may be in complying with the determination of the duty cycle detecting circuit 140 to change the difference between the delay quantity of the pair of complementary clocks CLKT, CLKB, so as to generate a corresponding phase shift that makes the regenerated clock CLKO regenerated by the regenerating circuit 130 according to the new pair of phase-shifting clocks CLKTD, CLKBD having a corresponding phase shift. The regenerated clock CLKO may have a new duty cycle more closed to the predetermined value.

The method of correcting duty cycle may comprise steps of: generating a pair of phase-shifting clocks in complying with a pair of complementary clocks; regenerating a regenerated clock in complying with the pair of phase-shifting clocks; generating a detecting output in complying with a current duty cycle of the regenerated clock; and adjusting the pair of phase-shifting clocks in complying with the detecting output. For illustrating an embodiment applying the method of correcting duty cycle to generate a clock signal having a fixed duty cycle, referring to the DCC device 100 shown in FIG. 1, the method may be applied to generate the regenerated clock CLKO having the fixed duty cycle shown in FIG. 2, and the duty cycle may be closed to 50% for example, but not limited to it. However, the method of correcting duty cycle is not limited to the DCC device 100 shown in FIG. 1.

Figure 9:
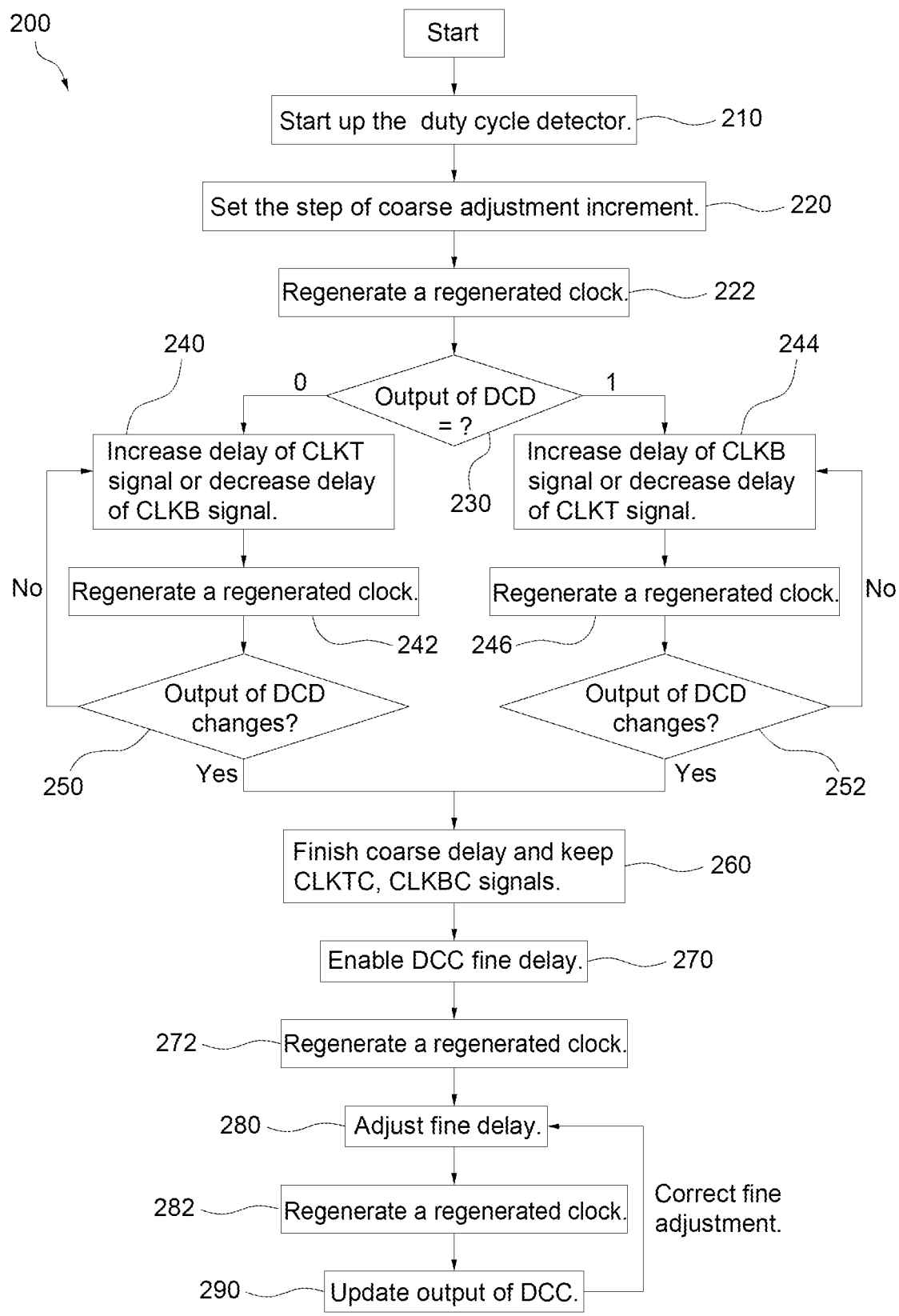
FIG. 9 depicts a flow chart of a method of correcting duty cycle according to an exemplary embodiment of the present invention.

Referring to FIGS. 1, 2 and 9, in which FIG. 9 depicts a flow chart of a method of correcting duty cycle according to an exemplary embodiment of the present invention. In the DCC device 100 of FIG. 1, the first delay line 104, the second delay line 106, the third delay line 107 and the fourth delay line 108 are configured by the coarse adjustment delaying unit 110 and the fine adjustment delaying unit 120 respectively. In the present embodiment, process that the DCC device 100 delays the pair of complementary clocks CLKT, CLKB on the first delay line 104 and the second delay line 106 to generate the pair of complementary clocks CLKT, CLKB having the phase shift may be specified with coarse delay steps 220, 260 performed firstly and a fine delay step 270 performed later. After performing the coarse delay steps and the fine delay step, steps 222, 242, 246, 272, 282 relating to regenerating the regenerated clock CLKO, steps 230, 250, 252, 290 relating to detecting the current duty cycle of the regenerated clock CLKO and steps 240, 244, 280 relating to adjusting the delay of the pair of complementary clocks CLKT, CLKB on the first delay line 104, the second delay line 106, the third delay line 107 or the fourth delay line 108 may be performed. Preferably, the controller of the duty cycle correcting circuit 150 may optionally control the coarse adjustment delaying unit 110 to perform the coarse delay steps during an idle time, such as: start-up duration, locked duration in a delay-locked loop (DLL), and perform the fine delay step during normal operation.

At first, according to the method of correcting duty cycle 200 of the present embodiment, in the step 210, the duty cycle detector (DCD) 140 may be started-up. Then, in the step 220, the controller of the duty cycle correcting circuit 150 may control the coarse adjustment delaying unit 110 to delay the pair of complementary clocks CLKT, CLKB with the pre-set coarse adjustment step(s) to make the phase shift of the pair of complementary clocks CLKT, CLKB generated. Then, in the step 222, the controller of the duty cycle correcting circuit 150 may control the regenerating circuit 130 to regenerate the regenerated clock CLKO in complying with the pair of first clocks CLKTC, CLKBC having the phase shift. Afterwards, in the step 230, the DCD 140 may detect the current duty cycle of the regenerated clock CLKO, determine if the current duty cycle reaches the predetermined value, and generate an output according to its determination. If the output indicating that the current duty cycle is greater than the predetermined value, "0" indicating that the current duty cycle is too big may be output, and in the step 240, the controller of the duty cycle correcting circuit 150 may control the coarse adjustment delaying unit 110 in complying with the output to increase the delay of the pair of complementary clocks CLKT, CLKB on the first delay line or decrease the delay of the pair of complementary clocks CLKT, CLKB on the second delay line 106, so as to generate a less phase shift. For example, the delay of the pair of complementary clocks CLKT, CLKB on the second delay line 106 may be decreased with reducing the coarse adjustment steps used here, such as: changing from two steps of coarse adjustment increment to one step of coarse adjustment increment. After the step 240, in the step 242, the controller of the duty cycle correcting circuit 150 may control the regenerating circuit 130 to regenerate the regenerated clock CLKO again in complying with the pair of first clocks CLKTC, CLKBC adjusted with the coarse adjustment steps. Afterwards, in the step 250, DCD 140 may detect the current duty cycle of the regenerated clock CLKO, determine if the current duty cycle reaches the predetermined value, and generate the output according to its determination. If the output is the same as the previous output, i.e., the output is not changed, this implies more adjustment is needed, and therefore the step 240 is repeated. If the output is not the same as the previous output, i.e., the output is changed, this implies the coarse adjustment steps currently used here may form the duty cycle of the current regenerated clock CLKO is the one the most closed to the predetermined value in light of a precision of the coarse adjustment delaying unit 110. Therefore, the duty cycle of the current regenerated clock CLKO reaches the predetermined value, and the step 260 may be performed. However, in the step 230, if the output of the DCD 140 indicates that current duty cycle is less than predetermined value, "1" indicating that current duty cycle is too small may be output, and in the step 244, the controller of the duty cycle correcting circuit 150 may control the coarse adjustment delaying unit 110 to decrease the delay of the pair of complementary clocks CLKT, CLKB on the first delay line or increase the delay of the pair of complementary clocks CLKT, CLKB on the second delay line 106 in complying with the output to generate more phase shift. For example, on the second delay line 106, the coarse adjustment steps used to delay the pair of complementary clocks CLKT, CLKB may be added, such as: changing from two steps of the coarse adjustment increment to three steps of the coarse adjustment increment. Later, in the step 246, the controller of the duty cycle correcting circuit 150 may control the regenerating circuit 130 to regenerate the regenerated clock CLKO in complying with the pair of first clocks CLKTC, CLKBC adjusted with the coarse adjustment steps. Then, in the step 252, the DCD 140 may detect the current duty cycle of the regenerated clock CLKO, determine if the current duty cycle reaches the predetermined value, and generate the output according to its determination. If the output is the same as the previous output, i.e., the output is not changed, this implies that more adjustment is needed, and therefore the step 244 is repeated. If the output is not the same as the previous output, i.e., the output is changed, this implies that the coarse adjustment steps currently used here may form the duty cycle of the current regenerated clock CLKO is the one the most closed to the predetermined value in light of a precision of the coarse adjustment delaying unit 110, and then the step 260 may be performed. In the step 260, the coarse delay has been finished, and at this time, the phase shift between the pair of first clocks CLKTC, CLKBC is the first phase shift caused by the coarse delay, and the first phase shift corresponds to the increasing multiples of a coarse adjustment increment. The pair of first clocks CLKTC, CLKBC is kept for fine delay.

Then, in the step 270, the controller of the duty cycle correcting circuit 150 may control the fine adjustment delaying unit 120 to enable the fine delay to delay the pair of first clocks CLKTC, CLKBC having the first phase shift on the third delay line 107 and the fourth delay line 108 with the pre-set fine adjustment steps, so as to generate the additional second phase shift. In the step 272, the controller of the duty cycle correcting circuit 150 may control the regenerating circuit 130 to regenerate the regenerated clock CLKO in complying with the fine-delayed pair of phase-shifting clocks CLKTD, CLKBD. Then, in the step 280, the controller of the duty cycle correcting circuit 150 may further adjust the fine delay of the pair of first clocks CLKTC, CLKBC on the third delay line 107 and the fourth delay line 108 to generate the corresponding phase shift, such as: adjusting the fine adjustment steps used here. Similar to the steps 230, 240, 242, 250, 244, 246, 252, the DCD 140 may detect the current duty cycle of the regenerated clock CLKO, determine if the current duty cycle reaches the predetermined value, generate the output according to the determination, and then the controller of the duty cycle correcting circuit 150 may control the fine adjustment delaying unit 120 in complying with the output, and change the delay of the pair of first clocks CLKTC, CLKBC on the third delay line 107 and the fourth delay line 108 to generate more or less phase shift. Afterwards, in the step 282, the controller of the duty cycle correcting circuit 150 may control the regenerating circuit 130 to regenerate the regenerated clock CLKO again in complying with the fine-delayed pair of phase-shifting clocks CLKTD, CLKBD. Then, it may be readily understood that the duty cycle of the updated pair of phase-shifting clocks CLKTD, CLKBD which is adjusted in the step 280, compared with the duty cycle of the former pair of phase-shifting clocks CLKTD, CLKBD, the new duty cycle is more closed to the predetermined value. In the step 290, when the controller of the duty cycle correcting circuit 150 may determine that the DCD 140 updates its output, the step 280 may be repeated to adjust the fine delay of the pair of first clocks CLKTC, CLKBC on the third delay line 107 and the fourth delay line 108 again. Preferably, the controller of the duty cycle correcting circuit 150 may continuously determine if the DCD 140 updates its output to keep stability of the duty cycle of the regenerated clock. A sum of the first phase shift and the second phase shift is the phase shift, and the coarse adjustment increment is greater than the fine adjustment increment.

As mentioned above, the device and method of correcting duty cycle may delay the pair of complementary clocks with the first delay line 104, the second delay line 106, the third delay line 107 and the fourth delay line 108 to generate the phase shift of the pair of complementary clocks, so as to generate the clock signal having the fixed duty cycle and low jitter at the rising and falling edge to solve the problems of long locked time of the duty cycle, rigid and inflexible structure, limited frequency and low stability in the current technology, and preferable the clock signal may have high stability and precision.

While various embodiments in accordance with the disclosed principles been described above, it should be understood that they are presented by way of example only, and are not limiting. Thus, the breadth and scope of exemplary embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantage.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A device of correcting duty cycle, comprising:
   a duty cycle correcting circuit, generating a pair of phase-shifting clocks in accordance with a pair of complementary clocks, regenerating a regenerated clock in accordance with the pair of phase-shifting clocks, and comprising a coarse adjustment delaying unit, a fine adjustment delaying unit and a regenerating circuit in series connection sequentially, wherein:

the coarse adjustment delaying unit delays the pair of complementary clocks to generate a pair of first clocks having a first phase shift, the fine adjustment delaying unit delays the pair of first clocks to generate the pair of phase-shifting clocks having a second phase shift, and the regenerating circuit regenerates the regenerated clock in accordance with the pair of phase-shifting clocks;

a controller of the duty cycle correcting circuit, coupling to the duty cycle correcting circuit; and a duty cycle detecting circuit, coupling to the duty cycle correcting circuit and the controller of the duty cycle correcting circuit, and generating a detecting output to the controller of the duty cycle correcting circuit in accordance with a current duty cycle of the regenerated clock;

wherein the controller of the duty cycle correcting circuit controls the duty cycle correcting circuit in accordance with the detecting output to adjust the pair of phase-shifting clocks.

2. The device of correcting duty cycle according to claim 1, wherein the duty cycle detecting circuit receives the regenerated clock, detects the current duty cycle of the regenerated clock, determines if the current duty cycle reaches a predetermined value, and outputs the detecting output generated in accordance with a determination to the controller of the duty cycle correcting circuit, and wherein the controller of the duty cycle correcting circuit adjusts delay of one of the coarse adjustment delaying unit and the fine adjustment delaying unit in the pair of complementary clocks to make the pair of phase-shifting clocks generated by the regenerating circuit.

3. The device of correcting duty cycle according to claim 1, wherein the coarse adjustment delaying unit comprises a first delay line and a second delay line, both the first delay line and the second delay line comprise a plurality of coarse adjustment steps, the coarse adjustment delaying unit receives the pair of complementary clocks, delays the pair of complementary clocks on the first delay line and the second delay line with setting of the coarse adjustment steps to generate the pair of first clocks having the first phase shift between the pair of complementary clocks, and the first phase shift corresponds to increasing multiples of a coarse adjustment increment.

4. The device of correcting duty cycle according to claim 3, wherein the fine adjustment delaying unit comprises a third delay line and a fourth delay line, the third delay line and the fourth delay line comprise a plurality fine adjustment steps, the fine adjustment delaying unit receives the pair of first clocks having the first phase shift, delays the pair of first clocks having the first phase shift on the third delay line and the fourth delay line with setting of the fine adjustment steps to generate the pair of phase-shifting clocks having the second phase shift between the pair of first clocks, and the second phase shift corresponds to increasing multiples of a fine adjustment increment, and wherein the coarse adjustment increment is greater than the fine adjustment increment.

5. The device of correcting duty cycle according to claim 4, wherein each of the third delay line and the fourth delay line comprises:

a plurality of inverters in series with each other, and one of the pair of first clocks having the first phase shift input to a first one of the inverters; and a plurality of variable capacitor, coupling to an output end of the inverters respectively.

6. The device of correcting duty cycle according to claim 4, wherein the coarse adjustment increment is greater than or equal to twice of the fine adjustment increment.

7. The device of correcting duty cycle according to claim 6, wherein the coarse adjustment increment is greater than or equal to ten times of the fine adjustment increment.

8. The device of correcting duty cycle according to claim 3, wherein each of the first delay line and the second delay line further comprises:

P first NAND gates in series with each other, one of the pair of complementary clocks input to a first one of the P first NAND gates;

P second NAND gates in series with each other;

P third NAND gates in parallel with the first NAND gates and the second NAND gates, an input end of a n-th third NAND gate coupling to a n-th first NAND gate, an output end of a n-th third NAND gate coupling to an input end of a P-n+1-th second NAND gate, n being an integer of 1, 2 . . . P; and an inverter, coupling to an output end of a P-th second NAND gate.

9. The device of correcting duty cycle according to claim 3, wherein when the detecting output indicates that the current duty cycle is greater than a predetermined value, the controller of the duty cycle correcting circuit increases delay of the pair of complementary clocks on the first delay line or decreases delay of the pair of complementary clocks on the second delay line in accordance with the detecting output to generate the pair of first clocks having less first phase shift, and when the detecting output indicates that the current duty cycle is less than the predetermined value, the controller of the duty cycle correcting circuit decreases the delay of the pair of complementary clocks on the first delay line or increases the delay of the pair of complementary clocks on the second delay line in accordance with the detecting output to generate the pair of first clocks having more first phase shift.

10. The device of correcting duty cycle according to claim 1, wherein the regenerating circuit regenerates the regenerated clock having a new duty cycle in accordance with the pair of phase-shifting clocks, and compared with the current duty cycle, the new duty cycle is closer to the predetermined value.

11. The device of correcting duty cycle according to claim 10, wherein the regenerating circuit further comprises:

two fourth NAND gates, receiving one of the pair of phase-shifting clocks respectively and a corresponding delayed clock and outputting a rising-edge triggering clock and a falling-edge triggering clock respectively; and two fifth NAND gates, one of the fifth NAND gates receiving the rising-edge triggering clock and output of the other one of the fifth NAND gates, the other one of the fifth NAND gates receiving the falling-edge triggering clock and output of the one of the fifth NAND gates, and outputting the regenerated clock.

12. The device of correcting duty cycle according to claim 11, wherein the regenerating circuit further comprises:

two sets of logic gates, each set of logic gates comprises a AND gate and a NOT gate, in series with an input end of the fourth NAND gates, delaying one of the pair of phase-shifting clocks to generate the corresponding delayed clock.

13. The device of correcting duty cycle according to claim 1, further comprising:

a splitter, generating the pair of complementary clocks in which two clocks are complementary to each other.

14. A method of correcting duty cycle, comprising steps of:
generating a pair of phase-shifting clocks in accordance with a pair of complementary clocks, further comprising:
delaying the pair of complementary clocks with a coarse adjustment delaying unit to generate a pair of first clocks;
delaying the pair of first clocks with a fine adjustment delaying unit to generate the pair of phase-shifting clocks; and
regenerating the regenerated clock in accordance with a phase-shift signal;
regenerates a regenerated clock in accordance with the pair of phase-shifting clocks;
generating a detecting output in accordance with a current duty cycle of the regenerated clock; and
adjusting the pair of phase-shifting clocks in accordance with the detecting output.

15. The method of correcting duty cycle according to claim 14, wherein the step of generating a detecting output in accordance with a current duty cycle of the regenerated clock further comprises:
detecting the current duty cycle of the regenerated clock; and
determining if the current duty cycle reaches a predetermined value and outputting the detecting output in accordance with a determination.

16. The method of correcting duty cycle according to claim 14, wherein the coarse adjustment delaying unit comprises a first delay line and a second delay line, both the first delay line and the second delay line comprise a plurality of the coarse adjustment steps, and the step of delaying the pair of complementary clocks with a coarse adjustment delaying unit to generate a pair of first clocks, performed by the coarse adjustment delaying unit further comprises:
delaying the pair of complementary clocks on the first delay line and the second delay line with setting of the coarse adjustment steps to generate the pair of first clocks having a first phase shift between the pair of complementary clocks, and generating the first phase shift corresponding to increasing multiples of a coarse adjustment increment.

17. The method of correcting duty cycle according to claim 16, wherein the fine adjustment delaying unit comprises a third delay line and a fourth delay line, both the third delay line and the fourth delay line comprises a plurality of the fine adjustment steps, and the step of delaying the pair of first clocks with a fine adjustment delaying unit to generate the pair of phase-shifting clocks further comprises:
delaying the pair of first clocks having the first phase shift on the third delay line and the fourth delay line with setting of the fine adjustment steps to generate the pair of phase-shifting clocks having a second phase shift between the pair of first clocks, and generating the second phase shift corresponding to increasing multiples of a fine adjustment increment;
wherein the coarse adjustment increment is greater than the fine adjustment increment.

18. The method of correcting duty cycle according to claim 17, further comprising:
providing the coarse adjustment increment which is greater than or equal to twice of the fine adjustment increment.

19. The method of correcting duty cycle according to claim 18, further comprising:
providing the coarse adjustment increment which is greater than or equal to ten times of the fine adjustment increment.

20. The method of correcting duty cycle according to claim 16, wherein the step of delaying the pair of complementary clocks on the first delay line and the second delay line with setting of the coarse adjustment steps to generate the pair of first clocks having a first phase shift between the pair of complementary clocks further comprises:
when the detecting output indicates that the current duty cycle is greater than the predetermined value, increasing delay of the pair of complementary clocks on the first delay line or decreasing delay of the pair of complementary clocks on the second delay line in accordance with the detecting output to generate the pair of first clocks having less first phase shift; and
when the detecting output indicates that the current duty cycle is less than the predetermined value, decreasing the delay of the pair of complementary clocks on the first delay line or increasing the delay of the pair of complementary clocks on the second delay line to generate the pair of first clocks having more first phase shift.

21. The method of correcting duty cycle according to claim 14, further comprising:
regenerating the regenerated clock having a new duty cycle in accordance with the pair of phase-shifting clocks, wherein compared with the current duty cycle, the new duty cycle is closer to the predetermined value.

* * * * *